United States Patent
Lee et al.

(10) Patent No.: US 7,763,881 B2
(45) Date of Patent: Jul. 27, 2010

(54) PHOTONIC CRYSTAL LIGHT EMITTING DEVICE

(75) Inventors: Dong Yul Lee, Gyunggi-do (KR); Seong Ju Park, Gwangju (KR); Min Ki Kwon, Jeollabuk-do (KR); Ja Yeon Kim, Jeollabuk-do (KR); Dong Joon Kim, Gyunggi-do (KR); Yong Chun Kim, Gyunggi-do (KR); Je Won Kim, Seoul (KR)

(73) Assignee: Samsung LED., Ltd., Gyunggi-do (KR)

( * ) Notice: Subject to any disclaimer, the term of this patent is extended or adjusted under 35 U.S.C. 154(b) by 0 days.

(21) Appl. No.: 12/182,509

(22) Filed: Jul. 30, 2008

(65) Prior Publication Data

US 2009/0032800 A1 Feb. 5, 2009

(30) Foreign Application Priority Data

Jul. 30, 2007 (KR) .................. 10-2007-0076375

(51) Int. Cl.
*H01L 29/06* (2006.01)
(52) U.S. Cl. .................. 257/13; 257/98; 257/99; 257/84; 257/94; 257/103; 257/79
(58) Field of Classification Search .............. 257/13.09, 257/99, 86, 94, 103, 79
See application file for complete search history.

(56) References Cited

U.S. PATENT DOCUMENTS

2006/0223211 A1* 10/2006 Mishra et al. ................. 438/41
2007/0041214 A1* 2/2007 Ha et al. ..................... 362/612

FOREIGN PATENT DOCUMENTS

JP 2004-134501 4/2004

* cited by examiner

*Primary Examiner*—Long Pham
(74) *Attorney, Agent, or Firm*—McDermott Will & Emery LLP

(57) ABSTRACT

There is provided a photonic crystal light emitting device including: a substrate; a plurality of nano rod light emitting structures formed on the substrate to be spaced apart from one another, each of the nano rod light emitting structures including a first conductivity type semiconductor layer, an active layer and a second conductivity type semiconductor layer; and first and second electrodes electrically connected to the first and second conductivity type semiconductor layers, respectively, wherein the nano rod light emitting structures are arranged with a predetermined size and period so as to form a photonic band gap for light emitted from the active layer, whereby the nano rod light emitting structures define a photonic crystal structure. In the photonic crystal light emitting device, the nano rod light emitting structures are arranged to define a photonic crystal to enhance light extraction efficiency.

10 Claims, 4 Drawing Sheets

PHOTONIC CRYSTAL LIGHT EMITTING DEVICE

CROSS-REFERENCE TO RELATED APPLICATIONS

This application claims the priority of Korean Patent Application No. 2007-0076375 filed on Jul. 30, 2007, in the Korean Intellectual Property Office, the disclosure of which is incorporated herein by reference.

BACKGROUND OF THE INVENTION

1. Field of the Invention

The present invention relates to a photonic crystal light emitting device, and more particularly, to a photonic crystal light emitting device in which nano rod light emitting structures are disposed to define a photonic crystal, thereby enhancing light extraction efficiency.

2. Description of the Related Art

A semiconductor light emitting diode (LED) is a semiconductor device generating light of various colors when a current is supplied due to recombination of electrons and holes at a junction portion of p- and n-type semiconductors. This LED exhibits advantages such as longer useful life, lower power consumption, superior initial driving characteristics and high vibration resistance over a filament-based light emitting device. This has led to a continuous increase in demand. Particularly, of late, a group III nitride semiconductor capable of emitting light at a short wavelength such as blue light has been highlighted.

In such a semiconductor light emitting device, light generated from the active layer is reflected to different degrees according to an incident angle thereof when incident on an interface between air/GaN. Theoretically, when the light is incident at an incident angle of at least 26°, the light generated from the active layer is totally internally reflected and the totally internally reflected light is guided outward through sides, or absorbed or attenuated inside to mainly degrade emission efficiency.

Therefore, as one of methods for minimizing these problems and enhancing external light extraction efficiency, microstructures have been formed on a surface where the light exits outside.

As described above, a technology of reducing total reflection through the microstructures may increase external light extraction efficiency to some degree. However, there is required a structure for ensuring better emission efficiency. Particularly, in a case where the microstructures are formed on the p-type semiconductor layer by dry etching, chiefly, induction coupled plasma reactive ion etching (ICP-RIE), a semiconductor crystal structure for electrical operation, particularly a crystal structure near an active layer is severely impaired. Furthermore, at this time, an n-type donor is generated in a p-doped area to reduce a doping concentration of the p-type semiconductor layer. This phenomenon occurs not only locally but spreads longitudinally and horizontally. Accordingly, this may cause the semiconductor light emitting device to malfunction as an electrical driving device.

SUMMARY OF THE INVENTION

An aspect of the present invention provides a photonic crystal light emitting device in which nano rod light emitting structures are arranged to define a photonic crystal, thereby enhancing light extraction efficiency.

According to an aspect of the present invention, there is provided a photonic crystal light emitting device including: a substrate; a plurality of nano rod light emitting structures formed on the substrate to be spaced apart from one another, each of the nano rod light emitting structures including a first conductivity type semiconductor layer, an active layer and a second conductivity type semiconductor layer; and first and second electrodes electrically connected to the first and second conductivity type semiconductor layers, respectively, wherein the nano rod light emitting structures are arranged with a predetermined size and period so as to form a photonic band gap for light emitted from the active layer, whereby the nano rod light emitting structures define a photonic crystal structure.

Portions between the nano rod light emitting structures may be filled with a material having refractivity different from refractivity of a material for the light emitting structure.

The material filled in the portions between the nano rod light emitting structures may be $SiO_2$.

The nano rod light emitting structure may have a bottom surface shaped as a circle and has a radius and period satisfying following condition:

$$\leq r/a \leq 0.5 \qquad \text{condition.}$$

The nano rod light emitting structure may have a bottom surface shaped as one of a circle and a square.

The photonic crystal light emitting device may further include a second conductivity type semiconductor layer formed on the nano rod light emitting structures to cover the nano rod light emitting structures.

The photonic crystal light emitting device may further include an ohmic contact layer formed on the nano rod light emitting structures to cover the nano rod light emitting structures.

The photonic crystal light emitting device may further include a first conductivity type semiconductor layer formed between the substrate and the nano light emitting structures.

The first and second conductivity type semiconductor layers may be n-type and p-type semiconductor layers, respectively.

The first conductivity type semiconductor layer, the active layer and the second conductivity type semiconductor layer may be formed of a nitride, respectively.

The nano rod light emitting structure may have a size smaller than or identical to a wavelength of the light emitted from the active layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
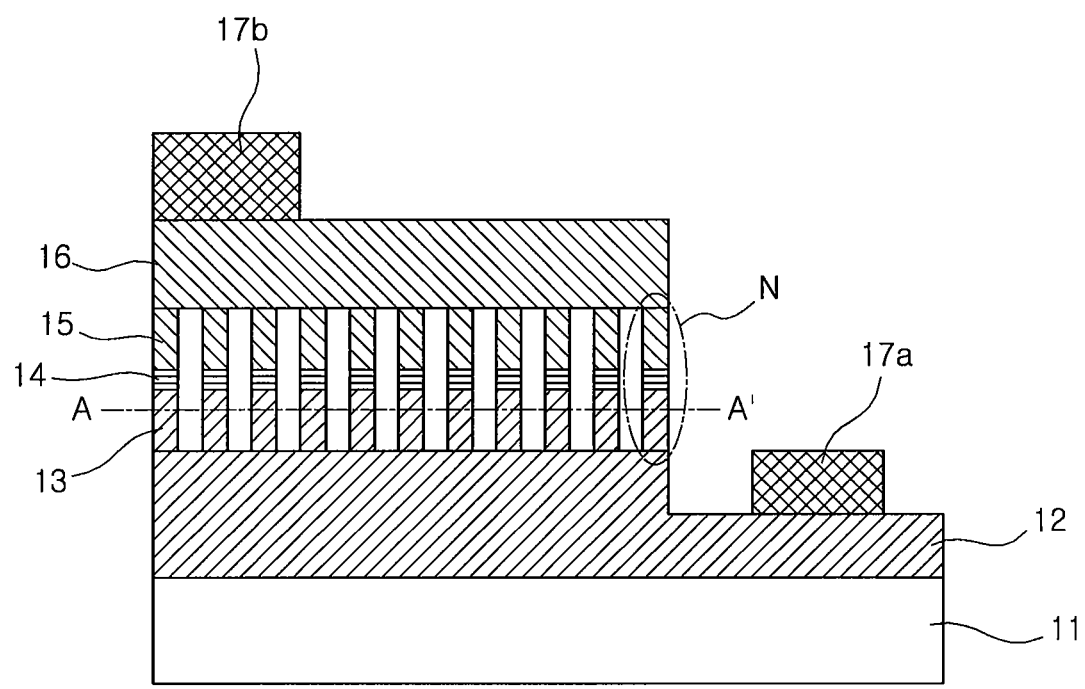
FIG. 1 is a cross-sectional view illustrating a photonic crystal light emitting device according to an exemplary embodiment of the invention.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

FIG. 1 is a cross-sectional view illustrating a photonic crystal light emitting device according to an exemplary embodiment of the invention.

Referring to FIG. 1, the photonic crystal light emitting device 10 of the present embodiment includes a sapphire substrate 11, an n-type semiconductor layer 12, a plurality of nano rod light emitting structures N, a p-type semiconductor layer 16, and n- and p-electrodes 17a and 17b.

The sapphire substrate 11 serves as a substrate for growing a semiconductor single crystal. The sapphire substrate 11 is a Hexa-Rhombo crystal. The sapphire substrate 11 has a lattice constant of 13.001 Å in c-axis orientation, and a lattice constant of 4.765 Å in a-axis orientation. A C-plane of this sapphire substrate 11 ensures a nitride film to be grown thereon relatively easily, and is stable even at a high temperature, thus predominantly utilized as a substrate for nitride growth. The substrate for growing a semiconductor single crystal applicable to the present embodiment is not limited to the sapphire substrate 11. Alternatively, a substrate generally used for single crystal growth, for example, a substrate formed of SiC, MgAl2O4, MgO, LiAlO2 or LiGaO2 may be employed.

The n-type semiconductor layer 12 formed on the substrate 11 may serve as a connecting part between a buffer layer for a nano rod structure formed thereon and electrodes rather than act as a light emitting structure. Here, then-type semiconductor layer 12 may be formed of a nitride semiconductor. In the specification, a "nitride semiconductor" denotes a binary, ternary or quaternary compound semiconductor represented by AlxInyGa(1-x-y)N, where $0 \leq x \leq 1$, $0 \leq y \leq 1$, and $0 \leq x+y \leq 1$. That is, the n-type semiconductor layer 12 may be formed of an n-doped semiconductor material represented by $Al_xIn_yGa_{(1-x-y)}N$, where $0 \leq x \leq 1$, $0 \leq y \leq 1$, and $0 \leq x+y \leq 1$. Representative examples of the n-type semiconductor layer 12 include GaN, AlGaN, and InGaN. The n-dopant may utilize Si, Ge, Se, Te or C.

Meanwhile, the n-type semiconductor layer 12 may be grown by a process of growing a semiconductor single crystal, particularly, metal-organic chemical vapor deposition (MOCVD), molecular beam epitaxy (MBE) or hydride vapor phase epitaxy (HVPE), which are known as a process for growing a nitride single crystal. This is construed to be applicable to other nitride semiconductor layer formed on the n-type semiconductor layer 12.

However, in other embodiments, the nano rod structures may be formed on the substrate without involving formation of the n-type semiconductor layer 12 on the substrate.

The nano rod light emitting structure N includes an n-type semiconductor layer 13, an active layer 14 and the p-type semiconductor layer 15 sequentially stacked. Thus, when power is supplied, the nano rod light emitting structure N can emit light by recombination of electrons and holes.

The "nano rod" in the specification denotes a rod-shaped material having a diameter ranging from several nm to tens of nm. The nano rod elongated into a line shape is referred to as a "nano wire".

As in the present embodiment, the light emitting structures formed of a nano rod structure ensure an increase in an overall emission area and better quantum effects. This accordingly leads to a big improvement in emission efficiency. Moreover, the light emitting structures formed of the nano rod structure allows superior crystallinity, thereby enhancing characteristics of the device.

Also, in the present embodiment, the plurality of nano rod light emitting structures N are arranged on the n-type semiconductor layer 12 to define a photonic crystal structure.

The photonic crystal structure is configured such that periodic lattice structures with different refractivities are fabricated to control transmission and generation of electromagnetic waves. In the periodic lattice structure with different refractivities, there exists a specific wavelength bandwidth where a propagation mode is not present due to effects of photonic crystals. A region where the propagation mode is not present is referred to as an electromagnetic band gap or a photonic band gap in a similar manner to an energy region where an electronic state cannot be present. The structure with such a band gap is termed a photonic crystal. Here, the photon crystal whose period is similarly sized to a wavelength of the light has a photonic band gap structure.

This photonic crystal structure enables control of light propagation and spontaneous emission as well, thereby enhancing performance of the photonic device and reducing size thereof.

That is, when the photon crystal is formed such that photons with a predetermined energy exist within the photonic band gap, the photons are prevented from being propagated sideward. This allows substantially all photons to be emitted outside the device, thereby increasing light extraction efficiency.

Therefore, in the present embodiment, the nano rod structure is improved in light efficiency and the light emitting structures define a photonic crystal structure to assure external light extraction efficiency.

To define this photonic crystal structure, the nano rod light emitting structures N are arranged two-dimensionally with a predetermined size and period on the n-type semiconductor layer 12. Here, the size of each of the light emitting structures N denotes the size of a bottom surface of the light emitting structure N. Particularly, when the light emitting structure N has a bottom surface shaped as a circle as shown in FIG. 2A, the size is construed to denote a radius thereof.

Figure 2A:
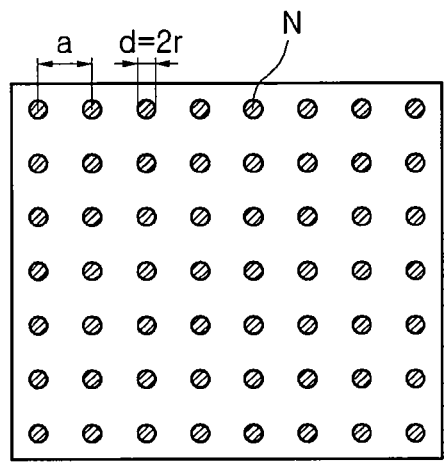
FIGS. 2A to 2C are cross-sectional shapes of the light emitting structure shown in FIG. 1, respectively.
Figure 2B:
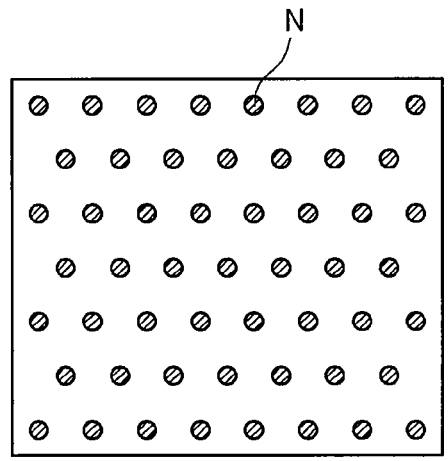
Figure 2C:
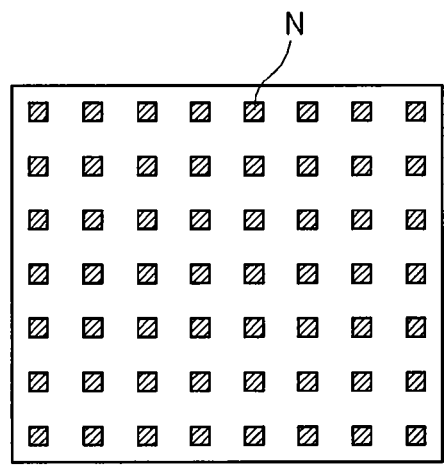

FIGS. 2A to 2C illustrate cross-sectional shapes of the nano rod light emitting structure, cut along the line A-A of FIG. 1.

First, referring to FIG. 2A, to define the photonic crystal structure, the nano rod light emitting structures N are formed with a predetermined period a and a size corresponding to a radius r (diameter d). Here, for the photonic crystal structure, the period a is determined to be identical to a wavelength λ of emitted light. The period a, wavelength λ and radius r of the light emitting structures affect formation of the photonic band gap. This will be described in more detail with reference to FIG. 3. Generally, given the wavelength of the light emitted from the active layer, the radius r may range from tens to hundreds of nanometers.

Meanwhile, the nano rod light emitting structures N shown in FIG. 2B have first and second rows staggered with respect to each other. This structure can be representatively adopted along with the structure shown in FIG. 2A.

Also, the nano rod light emitting structure N may have a bottom surface shaped as a generally applicable circle, or a square. The embodiment of FIG. 2C is a slightly modified example of FIG. 2A and the light emitting structure N has a bottom surface shaped as a square.

To further enhance emission efficiency, portions between the nano rod light emitting structures N are not filled with a specific material intentionally, i.e., air-filled. In other embodiments, the portions may not be filled with air but a material such as $SiO_2$. Here, in place of $SiO_2$, the portions between the light emitting structures N may be filled with a material having refractivity different from that of a material for the light emitting structures. For example, the material filled may adopt other oxide, an inorganic material or an organic material.

To form the nano rod light emitting structures N on the n-type semiconductor layer 12, first, a nano-sized catalyst metal pattern is formed on the n-type semiconductor layer 12. Then, a semiconductor layer is grown on the catalyst metal pattern by a proper deposition method, which is a known processor for fabricating a semiconductor. Here, the catalyst metal pattern is formed of a transition metal such as nickel and chrome. Such a transition metal can be applied on a top surface of the n-type semiconductor layer 12, heated and agglomerated into nano size to obtain the catalyst metal pattern.

However, known processes for forming the nano rod other than a process of employing a catalyst may be employed. For example, a process of utilizing an anodized aluminum oxide (AAO) as a template may be utilized.

The period a of the nano rod light emitting structures, the radius r of a bottom surface thereof and the wavelength λ of the light emitted from the active layer significantly affect formation of a photonic band gap. This will be described with reference to FIG. 3.

Figure 3:
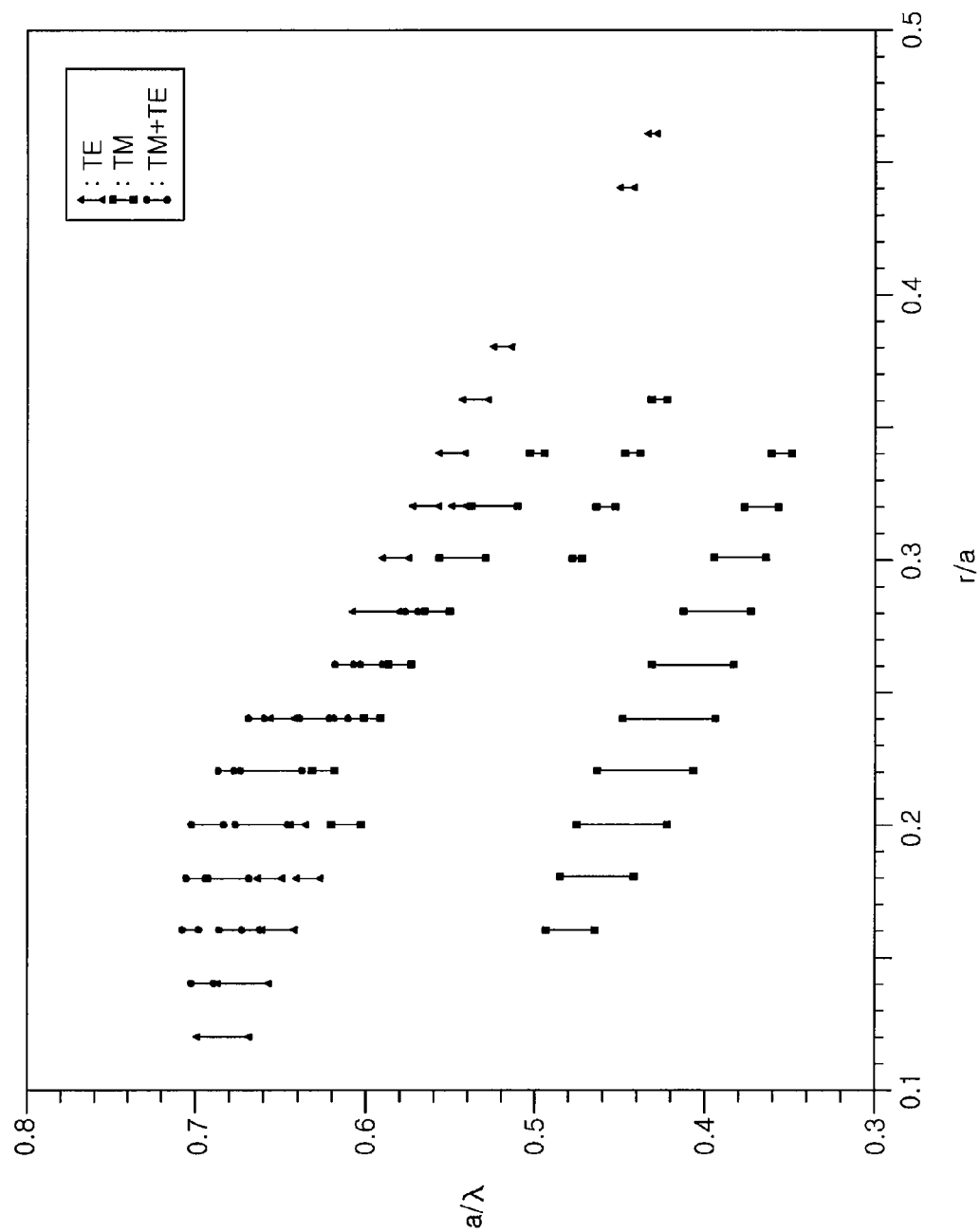
FIG. 3 is a graph illustrating a photonic band gap for forming a photonic crystal structure, in which a photonic band gap is simulated according to a radius(r)/period(a) value and a period(a)/wavelength($\lambda$)value.

FIG. 3 is a graph illustrating a photonic band gap for forming a photonic crystal structure, in which the photonic band gap is simulated according to a radius(r)/period(a) value and a period(a)/wavelength(λ) value. Here, the light emitted from the active layer of the light emitting structures, which is used for simulation, has a wavelength of 460 nm.

Referring to FIG. 3, lines each connected by two identical ones of triangular, square and circular shapes correspond to a size of the photonic band gap. In this case, a triangular figure represents a photonic band gap formed by a TE mode. A square figure represents a photonic band gap formed by a TM mode and a circular figure represents a photonic band gap formed by a joint mode of the TE and TM.

As described above, when the photonic crystal structure is formed such that photons having a predetermined energy exist within a photonic band gap, the photons are prevented from being propagated sideward. This allows substantially all photons to be emitted outward. That is, when the photons have an energy belonging to the photonic band gap shown in FIG. 3, external light extraction efficiency can be improved.

Therefore, the period a and radius r of the hole and the wavelength λ of the light can be adjusted in view of simulation results of FIG. 3 to form the photonic crystal structure. Here, the wavelength λ generally may be determined by characteristics of the light emitting device itself, and thus the period a and radius r of the hole may be adjusted accordingly. In the present embodiment, the wavelength λ is set to 430 nm.

Referring back to FIG. 1, the p-type semiconductor layer 16 formed to cover the plurality of the nano rod light emitting structures N may be a nitride semiconductor in the same manner as the n-type semiconductor layer 12. Here, representative examples of a p-type dopant may include Mg, Zn or Be. The p-type semiconductor layer 16, when formed to cover the nano rod light emitting structures N as in the present embodiment may allow the ohmic contact or reflective metal layer to be formed thereon easily.

The n- and p-electrodes 17a and 17b function as an electrode layer for electrical connection of the device. At this time, the n-electrode and p-electrode 17a and 17b are generally formed of an alloy containing Au. These n-electrode and p-electrode 17a and 17b can generally be formed by a conventional method of forming a metal layer, such as deposition and sputtering.

Figure 4:
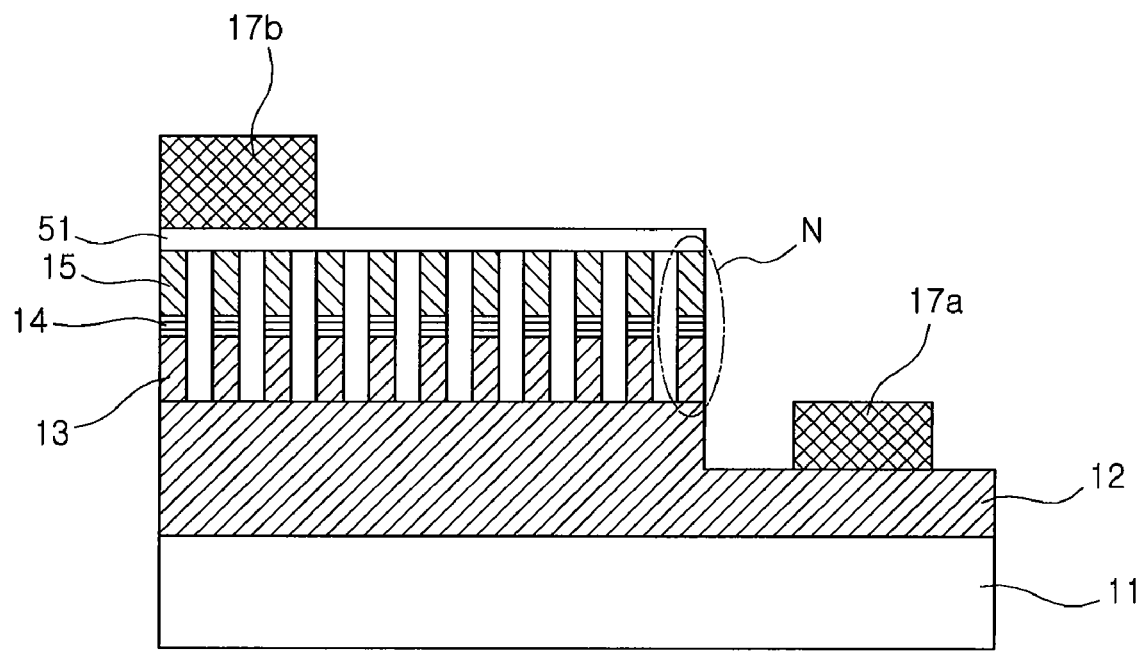
FIG. 4 is a cross-sectional view illustrating a photonic crystal light emitting device according to another exemplary embodiment of the invention.

FIG. 4 is a cross-sectional view illustrating a photonic crystal light emitting device according to another exemplary embodiment of the invention.

The photonic crystal light emitting device of the present embodiment is a slightly modified example of FIG. 1. Here, an ohmic contact layer 51 is employed in place of a p-type semiconductor layer. Therefore, the same components as those of FIG. 1 will be designated with the same reference numerals.

The ohmic contact layer 51 performs an ohmic contact function between the p-electrode 17b and the p-type semiconductor layer 15 constituting a nano rod. In a case where the electrode structure is a horizontal structure as in the present embodiment, the ohmic contact layer 51 may be formed of a transparent metal oxide not to hamper propagation of the light. Specifically, the ohmic contact layer 51 may be made of ITO, $In_2O_3$, $SnO_2$, MgO, $Ga_2O_3$, ZnO, and $Al_2O_3$. In a case where the electrode structure is a vertical structure, the reflective metal layer may be employed in place of the ohmic contact layer.

As set forth above, according to exemplary embodiments of the invention, nano rod light emitting structures are arranged to define a photonic crystal, thereby producing a photonic crystal light emitting device improved in light extraction efficiency. Furthermore, such a nano rod structure allows for superior crystallinity of the light emitting structures and thus enhances characteristics of the device.

While the present invention has been shown and described in connection with the exemplary embodiments, it will be apparent to those skilled in the art that modifications and variations can be made without departing from the spirit and scope of the invention as defined by the appended claims.

What is claimed is:

1. A photonic crystal light emitting device comprising:
   a substrate;
   a plurality of nano rod light emitting structures formed on the substrate to be spaced apart from one another, each of the nano rod light emitting structures including a first conductivity type semiconductor layer, an active layer and a second conductivity type semiconductor layer; and
   first and second electrodes electrically connected to the first and second conductivity type semiconductor layers, respectively,
   wherein the nano rod light emitting structures are arranged with a predetermined size and period so as to form a photonic band gap for light emitted from the active layer, whereby the nano rod light emitting structures define a photonic crystal structure and
   the nano rod light emitting structures has a bottom surface shaped as a circle and has a radius and period satisfying following condition:

$0.01 < r/a < 0.5$.

2. The photonic crystal light emitting device of claim 1, wherein portions between the nano rod light emitting structures are filled with a material having refractivity different from refractivity of a material for the light emitting structures.

3. The photonic crystal light emitting device of claim 2, wherein the material filled in the portions between the nano rod light emitting structures is $SiO_2$.

4. The photonic crystal light emitting device of claim 1, wherein the nano rod light emitting structures has a bottom surface shaped as one of a circle and a square.

5. A photonic crystal light emitting device comprising:
a substrate;
a plurality of nano rod light emitting structures formed on the substrate to be spaced apart from one another, each of the nano rod light emitting structures including a first conductivity type semiconductor layer, an active layer and a second conductivity type semiconductor layer; and
first and second electrodes electrically connected to the first and second conductivity type semiconductor layers, respectively,
wherein the nano rod light emitting structures are arranged with a predetermined size and period so as to form a photonic band gap for light emitted from the active layer, whereby the nano rod light emitting structures define a photonic crystal structure and
the second conductivity type semiconductor layer formed on the nano rod light emitting structures to cover the nano rod light emitting structures.

6. The photonic crystal light emitting device of claim 1, further comprising an ohmic contact layer formed on the nano rod light emitting structures to cover the nano rod light emitting structures.

7. A photonic crystal light emitting device comprising:
a substrate;
a plurality of nano rod light emitting structures formed on the substrate to be spaced apart from one another, each of the nano rod light emitting structures including a first conductivity type semiconductor layer, an active layer and a second conductivity type semiconductor layer; and
first and second electrodes electrically connected to the first and second conductivity type semiconductor layers, respectively,
wherein the nano rod light emitting structures are arranged with a predetermined size and period so as to form a photonic band gap for light emitted from the active layer, whereby the nano rod light emitting structures define a photonic crystal structure and
the first conductivity type semiconductor layer formed between the substrate and the nano light emitting structures.

8. The photonic crystal light emitting device of claim 1, wherein the first and second conductivity type semiconductor layers are n-type and p-type semiconductor layers, respectively.

9. The photonic crystal light emitting device of claim 1, wherein the first conductivity type semiconductor layer, the active layer and the second conductivity type semiconductor layer are formed of a nitride, respectively.

10. The photonic crystal light emitting device of claim 1, wherein the nano rod light emitting structure has a size smaller than or identical to a wavelength of the light emitted from the active layer.

* * * * *